United States Patent [19]

Duckworth

[11] Patent Number: 4,486,845
[45] Date of Patent: Dec. 4, 1984

[54] RESOLVER TO INCREMENTAL SHAFT ENCODER CONVERTER

[75] Inventor: James J. Duckworth, Rockaway, N.J.

[73] Assignee: The Singer Company, Little Falls, N.J.

[21] Appl. No.: 401,193

[22] Filed: Jul. 23, 1982

[51] Int. Cl.³ .............................................. H03K 13/02
[52] U.S. Cl. ............................. 364/559; 340/347 SY; 340/870.18
[58] Field of Search .............................. 33/1 N, 1 PT; 340/347 CC, 347 SY, 870.18, 870.25, 870.35, 870.43, 315; 364/559

[56] References Cited

U.S. PATENT DOCUMENTS

| | | | |
|---|---|---|---|
| 3,634,838 | 1/1972 | Granqvist | 340/347 SY |
| 3,720,866 | 3/1973 | Avellar et al. | 364/559 |
| 3,866,214 | 2/1975 | Taylor | 340/347 SY |
| 3,914,760 | 10/1975 | Logue | 340/347 CC |
| 3,997,893 | 12/1976 | Games et al. | 340/347 SY |
| 4,164,729 | 8/1979 | Simon et al. | 340/347 SY |
| 4,360,889 | 11/1982 | Liedtke | 364/559 |

Primary Examiner—Felix D. Gruber
Attorney, Agent, or Firm—Morris Liss; T. W. Kennedy

[57] ABSTRACT

A circuit for duplicating the function of an incremental shaft encoder comprises a rugged resolver connected to a hybrid digital-analog circuit which generates output signals identical to those of a counterpart incremental encoder. The digital portion of the circuit includes terminals whereat absolute angle measurements of a shaft may be made.

6 Claims, 6 Drawing Figures

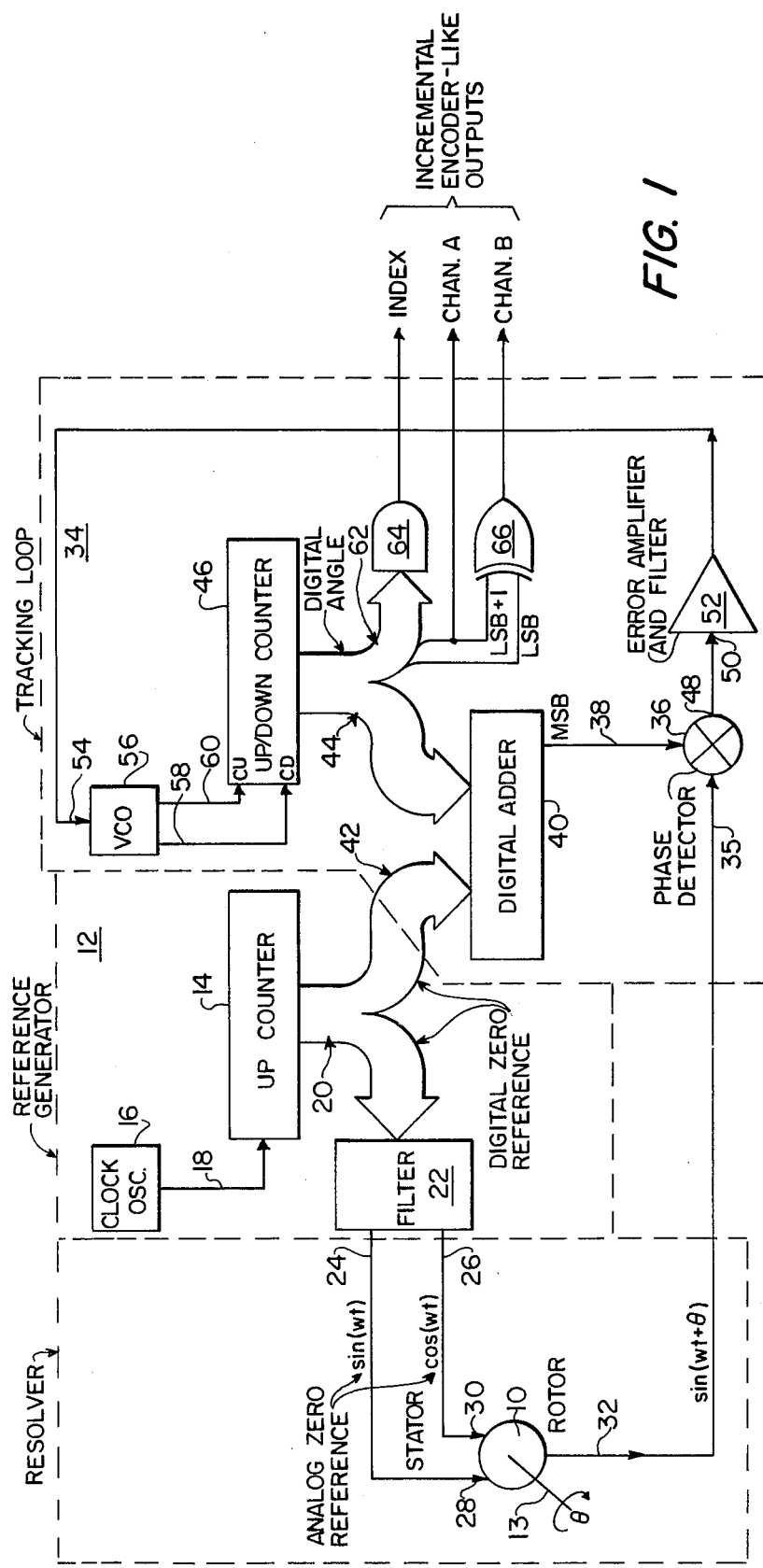
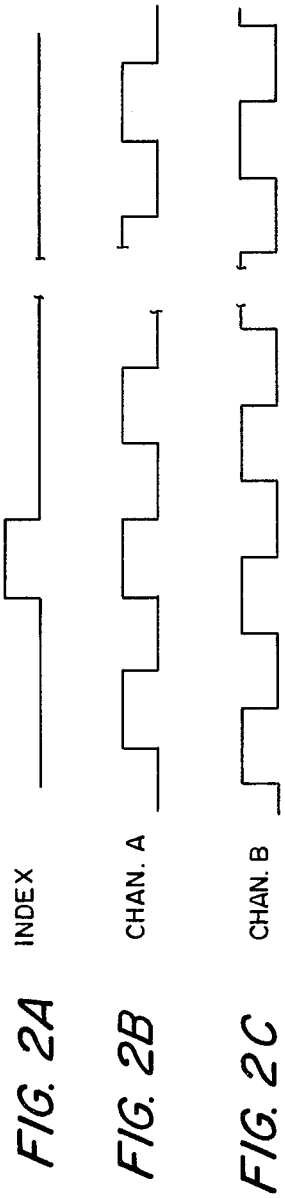
FIG. 1
FIG. 2A  INDEX
FIG. 2B  CHAN. A
FIG. 2C  CHAN. B

RESOLVER TO INCREMENTAL SHAFT ENCODER CONVERTER

FIELD OF THE INVENTION

The present invention relates to shaft rotation measurement devices and more particularly to a hybrid analog-digital circuit which duplicates the function of an optical incremental encoder.

BRIEF DESCRIPTION OF THE PRIOR ART

Modern electromechanical control systems have increasingly been turning to incremental (digital) rather than continuous (analog) techniques for control precision and easier interface to the digital world of the host computer or micro-computer. This trend is particularly well advanced in the machine tool and robot control field, where direct digital or numerical control has shown the way toward manufacturing automation.

The feedback elements for these incremental motion control systems are very often optical incremental encoders, due to the relatively low cost and ready availability of these devices, combined with direct digital outputs for easy computer interface. Optical incremental encoders do, however, have certain weaknesses which many users would rather do without. These are: susceptibility to airborne and other contaminants, the need to maintain long term precision relationships between the various optical elements under conditions of shock and vibration and the digital outputs are easily contaminated by unwanted noise pulses resulting from the necessity of transferring digital signals at high speed over long cables in an electrically noisy environment.

A conventional resolver is a very good, rugged feedback element which is mostly immune to the foregoing weaknesses; but, a resolver is an analog, absolute angular position sensor. It does not, in any direct way, easily interface to a motion control system designed for an optical incremental encoder feedback element.

BRIEF DESCRIPTION OF THE PRESENT INVENTION

The purpose of this invention is to provide the required signal conversion. This invention allows a resolver to be used in an electrically interchangeable manner, thus providing the general advantages of a resolver, to a control system designed for use with an optical incremental encoder, without the weaknesses of the encoder.

The above-mentioned objects and advantages of the present invention will be more clearly understood when considered in conjunction with the accompanying drawings, in which:

BRIEF DESCRIPTION OF THE FIGURES

FIG. 1 is a block diagram of the present converter.

FIGS. 2A–2C are waveforms of the outputs from the converter.

DETAILED DESCRIPTION OF THE INVENTION

Figure 3:
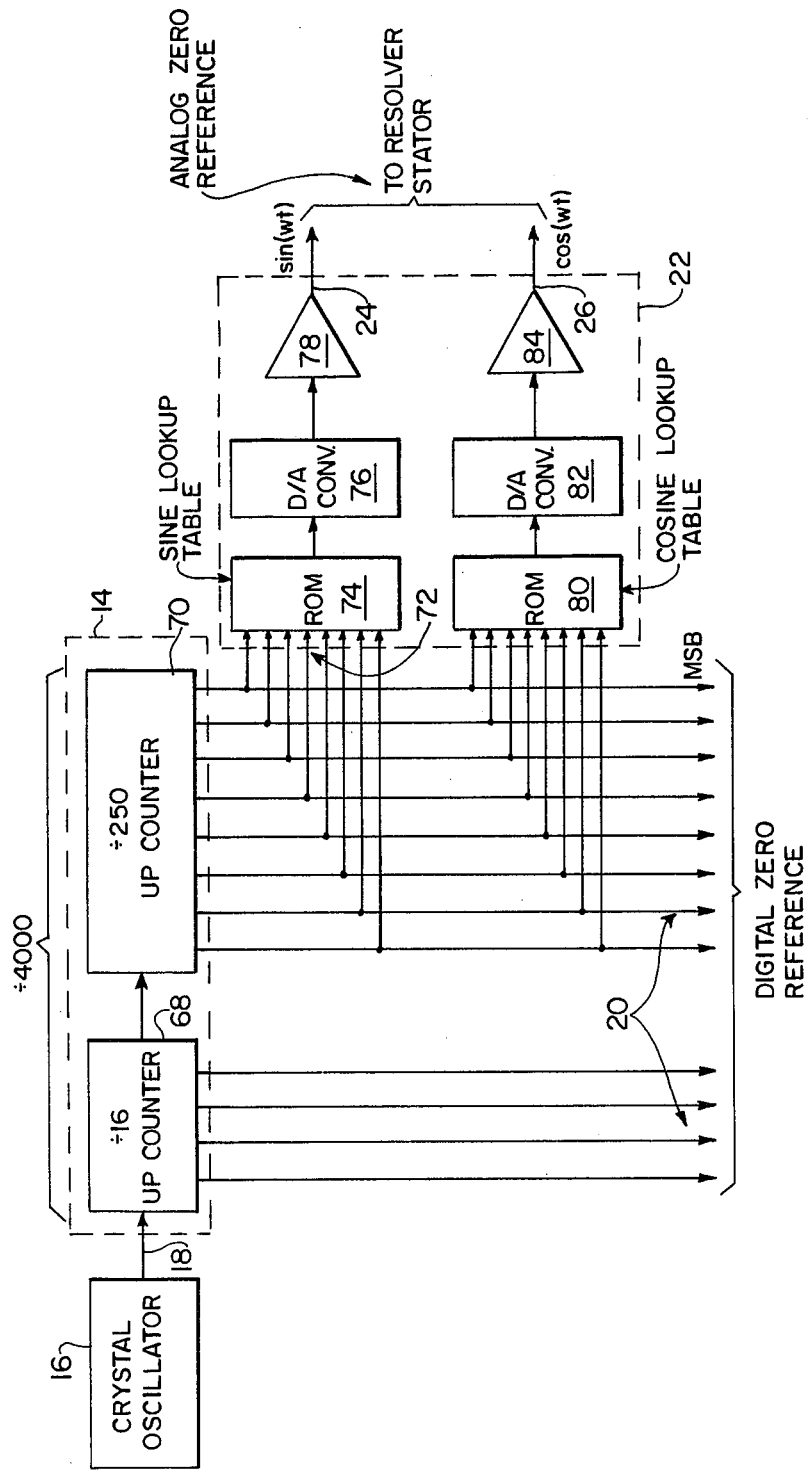
FIG. 3 is a block diagram of a reference generator portion of the converter.

The present converter circuit shown in FIG. 1 includes an input resolver 10 connected to a shaft 13 undergoing angular displacement $\theta$. In addition to the resolver 10, the converter includes a reference generator 12 which provides both digital and analog zero reference signals. The digital sum reference signal is generated by the action of a digital up-counter 14 which counts the cycles of a fixed frequency clock oscillator 16 connected to the counter's input 18. The analog zero reference is obtained by connecting the output 20 from up-counter 14 to filter 22 thereby producing two sine waveform signals displaced 90 degrees with respect to one another and of equal and constant amplitude. This is equivalent to the sine and cosine functions indicated at the output terminals 24 and 26 of filter 22. These signals provide inputs to the stator terminals 28 and 30 of resolver 10. Filter 22 or its equivalent ensures that a constant unchanging time relationship is maintained between the digital and the analog references.

When a resolver stator is excited in the manner provided by the analog zero reference signals as described and illustrated, the resolver rotor output 32 will be a constant amplitude sine waveform with a phase angle, relative to the analog zero reference, equal to the mechanical angle $\theta$ of the resolver shaft 13. Measuring this phase angle is therefore equivalent to measuring the resolver shaft mechanical angle.

The tracking loop 34 is interconnected with the reference generator 12 and resolver 10 to function in the following manner. The phase angle of the resolver rotor output 32 is expressed as $$\sin(\omega t + \theta)$$

This angle signal is provided to a first input 35 of phase detector 36. The first input is compared with the second phase detector input 38 representing the most significant bit (MSB) of the sum output of a digital adder 40. A first input 42 to the adder is the digital zero reference signal from reference generator 12 and a digital angle signal 44 from an up/down counter 46. If the phase of the resolver output is leading the phase of the MSB, the output 48 of phase detector 36 will be a positive analog voltage and a negative voltage for a lagging phase angle. If the two signals appearing at the inputs of the phase detector 36 are exactly in phase, then the output is zero. The phase detector output 48 is connected to the input 50 of error amplifier and filter circuit 52 which serves to condition the signal. From here, the signal is connected to the input 54 of a voltage controlled oscillator (VCO) 56. At the VCO outputs 58 and 60 is one of two pulse trains, at a particular instant, depending upon the polarity of the error output from phase detector 36. A positive voltage causes the counter to count up and a negative voltage causes it to count down. In either case, the MSB of digital adder 40 is moved toward being in phase with the resolver rotor output 32. The result of the foregoing is that the digital angle at 44 as represented by the state of the up/down counter, is made to track, that is stay in phase with the phase angle of the resolver rotor output 32 and therefore in phase with the resolver shaft angle $\theta$.

The incremental encoder-like outputs from the block illustrated in FIG. 1 are derived by digital manipulation of the outputs from up/down counter 46. AND gate 64 has its input terminals 62 presented with the digital angle represented by the output from up/down counter 46. Only one of all the many possible states of the up/down counter 46 is decoded by the AND gate to become the INDEX output having a waveform represented in FIG. 2A. The next-to-least significant bit (LSB+1) is used directly as the Channel A output having a waveform illustrated in FIG. 2B. The Channel B output is generated by the output from EXCLUSIVE-OR gate 66 having a first input connected to the least significant bit of the output from up/down counter 46 and a second input connected to the next-to-least significant bit therefrom (LSB+1). The waveform for Channel B is illustrated in FIG. 2C.

The output waveforms in FIGS. 2A–2C are electrically and spatially identical to those of the typical optical incremental encoder. The two main output signals on Channel A and Channel B are squarewave signals, each with the same number of cycles per revolution but displaced from each other by ¼ of a cycle. The index output is true only once per cycle coincident with the true portion of one of the Channel A cycles.

It should be pointed out that although the present invention is explained as an apparatus to duplicate the function of an optical incremental encoder, it is in fact capable of also providing an absolute angle measurement. This is accomplished by making available the digital angle signal at the output of up/down counter 46. This signal is a digital representation of the resolver shaft angle $\theta$.

FIG. 3 illustrates in greater detail the structure of the reference generator 12 previously discussed in connection with the block diagram of FIG. 1. In the illustrated implementation, the generator provides a resolver reference frequency of 2,500 Hertz, developed by dividing the frequency from crystal oscillator 16 (typically 10 MHz) by a factor of 4,000 in the reference generator's up-counter 14. Counter 14 may typically be configured as a divide-by-16 up-counter 68 having its output connected to the input of a divide-by-250 up-counter 70. The resulting 12 bits of up-counter output become the digital zero reference as indicated by reference numeral 20 in this figure and in FIG. 1. The analog zero reference is provided by digital-to-analog conversion as follows. The eight most significant bits are connected at the input terminals of block 22 which was indicated as a filter 22 in FIG. 1. In actuality, the input terminals 72 provide inputs to ROM 74 which contains a 250 point sine look-up table. The output from the ROM drives a digital-to-analog converter 76 having its output connected to a buffer amplifier 78. The output 24 of the buffer amplifier carries the analog/zero reference sin ($\omega t$) and corresponds to similarly numbered output terminal 24 in FIG. 1. In a similar manner, the eight most significant bits are connected to the input of a second branch of filter 22. In actuality, this second branch includes a ROM 80 which stores a 250 point cosine look-up table. The output from ROM 80 drives a digital-to-analog converter 82 which has its output connected to a second buffer amplifier 84. The output from buffer amplifier 84 represents a second component of the analog zero reference corresponding to cos ($\omega t$) indicated at 26 which corresponds to the similarly indicated output shown in FIG. 1. As previously explained in connection with FIG. 1, the outputs 24 and 26 are connected to resolver stator terminals 28 and 30.

Figure 4:
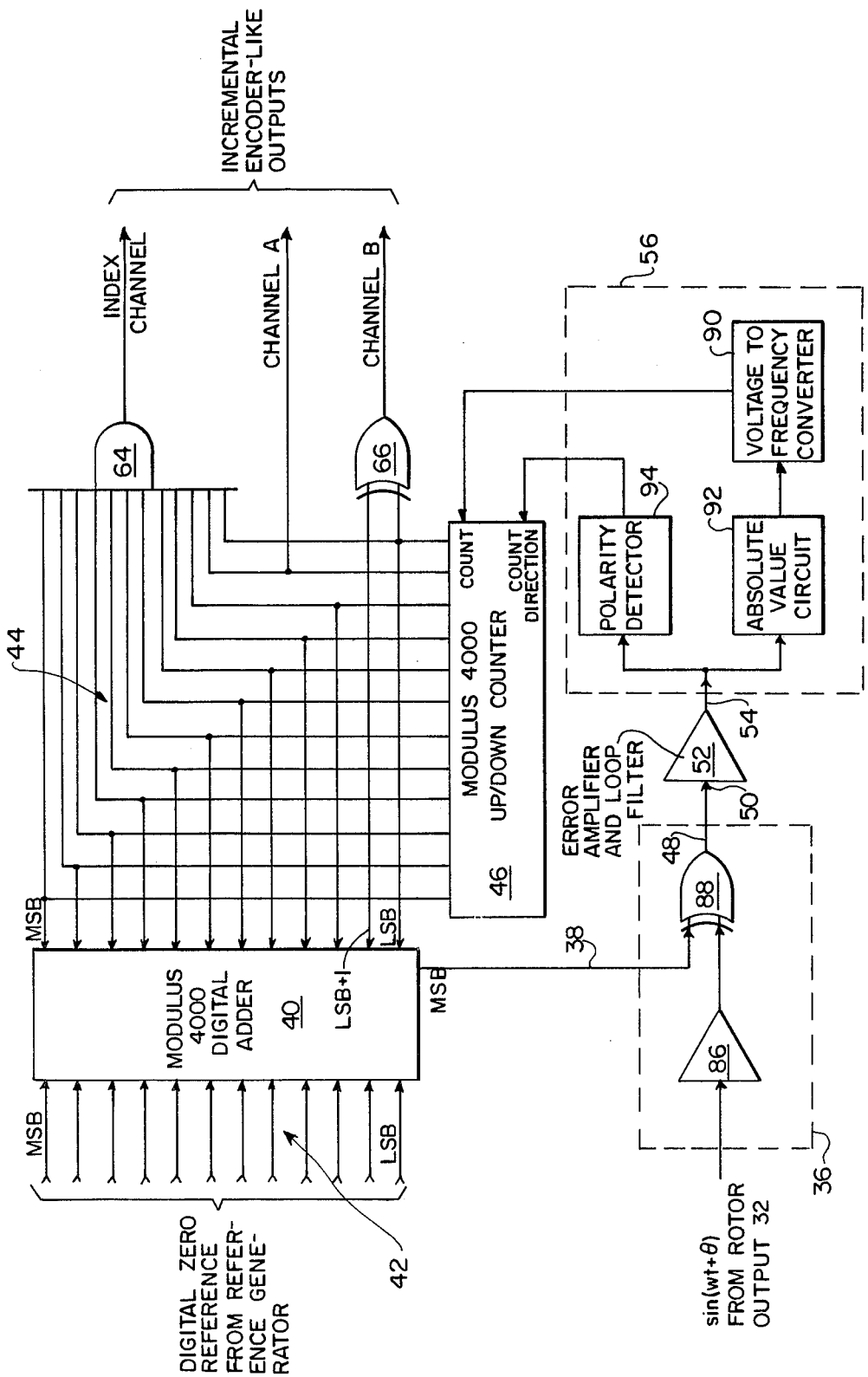
FIG. 4 is a block diagram of a tracking loop portion of the converter.

FIG. 4 illustrates in detail a typical implementation for tracking loop 34. The adder 40, previously shown and described in connection with FIG. 1, is shown in a preferred embodiment to be a modulus 4000 digital adder. The up/down counter 46 in a preferred embodiment of the present invention is a modulus 4000 counter. In correspondence with FIG. 1, the inputs to adder 40 are seen to include the first input 42 and second input, representing the digital angle signal 44.

The phase detector 36 illustrated in FIG. 1 is shown in greater detail in FIG. 4. It will be seen that the phase detector includes an analog comparator 86 connected to a first input of a CMOS EXCLUSIVE-OR gate 88. The second input to the gate is the most significant bit appearing at the second phase detector input 38.

A preferred implementation for the voltage controlled oscillator (VCO) 56, previously discussed in connection with FIG. 1, includes a voltage-to-frequency converter 90 which is driven by a conventional absolute value circuit 92. The input to the latter circuit appears at VCO input 54. The same VCO input is parallel connected to the input of a polarity detector 94 which controls the count direction as a function of the signal polarity appearing at input 54.

With the structure described, Channel A and B outputs of 1,000 cycles per revolution of the resolver are obtained so that these circuit outputs are identical to those obtained by an optical incremental encoder.

It should be noted that although the present discussion has been directed to a converter which is capable of duplicating the function of an optical incremental encoder, it is in fact capable of also providing an absolute angle measurement. This is accomplished by connecting the digital angle signal lines at 44 to an appropriate data processing utilization device. The result would be a measurement of resolver shaft angle $\theta$ providing an absolute angle encoding function with a resolution of one part in 4,000 as typical of performance.

It should be understood that the invention is not limited to the exact details of construction shown and described herein for obvious modifications will occur to persons skilled in the art.

I claim:

1. A device for measuring shaft angle comprising:
    a shaft driven resolver having a stator input and a rotor output;
    reference signal generating means for generating a digital zero reference signal;
    reference signal converting means for converting a digital zero reference signal to a corresponding analog zero reference signal which is connected to the stator's input resulting in a signal at the rotor output which is a sine waveform with a phase angle relative to the analog zero reference signal and equal to the mechanical angle of the resolver shaft;
    loop means having inputs connected to the digital zero reference signal generating means and the rotor output for tracking the phase angle of the resolver output and producing a digital angle signal corresponding thereto, wherein the reference signal converting means comprises:
    a first ROM storing a sine look-up table and connected at its input to the digital zero reference signal;
    first digital-to-analog converting means connected to the output of the first ROM for producing a first analog zero reference signal as a sine function;
    a second ROM storing a cosine look-up table and connected at its input to the digital zero reference signal; and
    second digital-to-analog converting means connected to the output of the second ROM for producing a second analog zero reference signal as a cosine function.

2. The device set forth in claim 1 wherein the loop means comprises:
- a digital adder having a first input thereof connected to the digital zero reference signal;
- a phase detector having a first input connected to the most significant bit of the digital adder and a second input connected to the rotor output wherein the detector compares the most significant bit of the adder with the phase angle of the resolver rotor;
- voltage controlled means having an input connected to an output of the phase detector to generate a signal which is indicative of the polarity of an error output from the phase detector;
- an up/down counter for counting in a direction dependent upon the indicative signal, the up/down counter generating a signal at the output thereof which corresponds to the digital angle of the resolver rotor; and
- means for connecting the up/down counter output to a second digital adder input.

3. The device set forth in claim 2 wherein the voltage controlled means comprises:
- an input terminal;
- means connected to the input terminal for detecting the polarity of the error output from the phase detector;
- means connected to the input terminal for generating a voltage corresponding to the absolute value of the error output; and
- voltage-to-frequency converting means connected between the absolute value generating means and an input of the up/down counter for incrementing the counter.

4. A device for measuring shaft angle comprising:
- a shaft driven resolver having a stator input and a rotor output;
- reference signal generating means for generating a digital zero reference signal;
- reference signal converting means for converting a digital zero reference signal to a corresponding analog zero reference signal which is connected to the stator's input resulting in a signal at the rotor output which is a sine waveform with a phase angle relative to the analog zero reference signal and equal to the mechanical angle of the resolver shaft;
- loop means having inputs connected to the digital zero signal generating means and the rotor output for tracking the phase angle of the resolver output and producing a digital angle signal corresponding thereto;
- gating means connected to the digital angle signal for generating a plurality of squarewave outputs with the same frequency but displaced from one another by a preselected portion of a cycle, wherein the reference signal generating means comprises:
- a clock oscillator;
- an up-counter driven by the oscillator for generating the digital zero reference signal at the output of the counter, and wherein the reference signal converting means comprises:
- a first ROM storing a sine look-up table and connected at its input to the digital zero reference signal;
- first digital-to-analog converting means connected to the output of the first ROM for producing a first analog zero reference signal as a sine function;
- a second ROM storing a cosine look-up table and connected at its input to the digital zero reference signal; and
- second digital-to-analog converting means connected to the output of the second ROM for producing a second analog zero reference signal as a cosine function.

5. The device set forth in claim 4 wherein the loop means comprises:
- a digital adder having a first input thereof connected to the digital zero reference signal;
- a phase detector having a first input connected to the most significant bit of the digital adder and a second input connected to the rotor output wherein the detector compares the most significant bit of the adder with the phase angle of the resolver rotor;
- voltage controlled means having an input connected to an output of the phase detector to generate a signal which is indicative of the polarity of an error output from the phase detector;
- an up/down counter for counting in a direction dependent upon the indicative signal, the up/down counter generating a signal at the output thereof which corresponds to the digital angle of the resolver rotor; and
- means for connecting the up/down counter output to a second digital adder input.

6. The subject device set forth in claim 5 wherein the voltage controlled means comprises:
- an input terminal;
- means connected to the input terminal for detecting the polarity of the error output from the phase detector;
- means parallel-connected to the input terminal for generating a voltage corresponding to the absolute value of the error output; and
- voltage-to-frequency converting means connected between the absolute value generating means and an input of the up/down counter for incrementing the counter.

* * * * *